(12) United States Patent
Rho et al.

(10) Patent No.: US 7,903,481 B2
(45) Date of Patent: Mar. 8, 2011

(54) PAGE BUFFER CIRCUIT, NONVOLATILE DEVICE INCLUDING THE SAME, AND METHOD OF OPERATING THE NONVOLATILE MEMORY DEVICE

(75) Inventors: Jun Rye Rho, Seoul (KR); Cheul Hee Koo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 130 days.

(21) Appl. No.: 12/493,403

(22) Filed: Jun. 29, 2009

(65) Prior Publication Data
US 2010/0142278 A1    Jun. 10, 2010

(30) Foreign Application Priority Data

Dec. 8, 2008    (KR) .................. 10-2008-0123869

(51) Int. Cl.
*G11C 7/00*    (2006.01)
(52) U.S. Cl. .......... 365/196; 365/205; 365/206; 365/207
(58) Field of Classification Search .................. 365/196, 365/205, 206, 207
See application file for complete search history.

(56) References Cited

U.S. PATENT DOCUMENTS

| 7,061,813 B2 * | 6/2006 | Lee | 365/189.05 |
| 7,313,028 B2 * | 12/2007 | Ju | 365/185.25 |
| 7,362,630 B2 * | 4/2008 | Mori et al. | 365/200 |

FOREIGN PATENT DOCUMENTS

KR    1020090058464 A    6/2009

OTHER PUBLICATIONS

Notice of Preliminary Rejection issued from Korean Intellectual Property Office on Jun. 28, 2010.

* cited by examiner

*Primary Examiner* — Pho M Luu
(74) *Attorney, Agent, or Firm* — IP & T Group LLP

(57) ABSTRACT

A page buffer circuit comprises a sense unit, a latch unit, and a bit line voltage control unit. The sense unit is configured to couple a bit line and a sense node in response to a sense control signal in response to the sense control signal. The latch unit includes a plurality of latch circuits configured to latch data programmed or to be programmed. The bit line voltage control unit is configured to classify program states of memory cells, coupled to the selected bit line, into first to $n^{th}$ groups by performing first to $n^{th}$ verification operations after a first program operation of a program operation and is configured to control a voltage level of the sense control signal in order to transfer a bit line voltage to the selected bit line.

20 Claims, 8 Drawing Sheets

PAGE BUFFER CIRCUIT, NONVOLATILE DEVICE INCLUDING THE SAME, AND METHOD OF OPERATING THE NONVOLATILE MEMORY DEVICE

CROSS-REFERENCE TO RELATED APPLICATION

Priority to Korean patent application number 10-2008-0123869 filed on Dec. 8, 2008, the entire disclosure of which is incorporated by reference herein, is claimed.

BACKGROUND

An embodiment relates to a page buffer circuit of a nonvolatile memory device and a program operation and, more particularly, to a page buffer circuit, a nonvolatile memory device including the page buffer circuit, and a method of operating the nonvolatile memory device, wherein the program speeds of memory cells are classified into some groups and the program speeds of the memory cells are controlled on a group basis so that the memory cells have a threshold voltage distribution with a narrow width thereof.

A NAND flash memory device (i.e., a type of a nonvolatile memory device) includes a memory cell array, a row decoder, and a page buffer. The memory cell array includes word lines extending in rows, bit lines extending in columns, and cell strings corresponding to the respective bit lines.

The row decoder coupled to a string selection line, the word lines, and a common source line is placed on one side of the memory cell array. The page buffer coupled to the bit lines is placed on the other side of the memory cell array.

Recently, in order to further increase the degree of integration of flash memory devices, researches have been made on a multi-bit cell which is capable of storing plural data in one memory cell. This type of a memory cell is generally called a multi-level cell (MLC). A memory cell capable of storing a single bit is called a single level cell (SLC).

Each of flash memory cells of a flash memory device includes a current path, formed between a source and a drain over a semiconductor substrate, and a floating gate and a control gate formed between insulating layers over the semiconductor substrate. Further, the program operation of a flash memory cell is generally performed by applying a high positive voltage to the control gate so that Fowler-Nordheim (F-N) tunneling is generated between the floating gate and the substrate in the state in which the source and drain regions of the memory cell and a semiconductor substrate (i.e., a bulk region) are grounded. In F-N tunneling, an electric field of a high voltage applied to the control gate causes electrons of the bulk region to be accumulated in the floating gate, and so the threshold voltage of the memory cell rises.

A nonvolatile memory device has higher reliability when the distribution of threshold voltages of a programmed memory cell has a narrower width thereof. Thus, it is important to narrow the distribution of threshold voltages when performing a program operation. One of the methods used to narrow the distribution of threshold voltages is a double verification method.

FIG. 1 is a diagram showing verification voltages when a double verification operation is performed in the distributions of threshold voltages.

Referring to FIG. 1, when memory cells included in a first threshold voltage distribution 110 (i.e., an erased cell state) are programmed, the threshold voltages of the memory cells shift to a second threshold voltage distribution 120.

Here, assuming that first cells C1 are memory cells having a fast program speed and second cells C2 are memory cells having a slow program speed, the distribution of threshold voltages of memory cells that should be programmed to have the second threshold voltage distribution 120 changes to a third threshold voltage distribution 130 because of the difference in the program speed for the same program voltage.

In order to control the program speeds of the memory cells, a double verification operation using a first verification voltage PV1 and a second verification voltage PV2 is carried out.

Although an actual program verification voltage is the second verification voltage PV2, the first memory cells C1 having a fast program speed are classified on the basis of the first verification voltage PV1.

The verification result of the first verification operation is stored in the latch of a page buffer of each bit line. Furthermore, a bit line voltage is changed according to a data state latched in the page buffer. A certain voltage (for example, a voltage higher than 0 V) is applied to a bit line that has passed the first verification operation, and 0 V is applied to a bit line that has not passed the first verification operation.

After the voltage is applied to the bit line as described above, a program voltage raised by a step voltage set according to an increment step program pulse (ISPP) method is applied to a corresponding word line, and a program operation is performed again.

When the voltage is applied to the bit line, the speed at which a memory cell that has passed the first verification operation is programmed can be reduced by controlling the degree of program for a program voltage. Accordingly, the width of a distribution of threshold voltages of memory cells can be narrowed by controlling the program speeds of memory cells that are rapidly programmed as compared with the program speeds of memory cells that are slowly programmed.

However, the double verification operation may have an extended program time because a verification operation must be performed twice whenever a program operation is performed and has limitations in narrowing the width of a distribution of threshold voltages because of the repeated performance of the verification operations.

BRIEF SUMMARY

One or more embodiments relate to a page buffer circuit, a nonvolatile memory device including the page buffer circuit, and a method of operating the nonvolatile memory device, wherein the program speeds of memory cells are classified into some groups by performing several verification operations in a similar way to a double verification operation upon a program operation, and the memory cells are programmed to have a narrow threshold voltage distribution by changing a program voltage based on the program speed of a corresponding memory cell on a group basis.

According to an embodiment, a page buffer circuit comprises a sense unit, a latch unit, and a bit line voltage control unit. The sense unit is configured to couple a bit line and a sense node in response to a sense control signal to detect a voltage of the selected bit line or transfer a voltage of the sense node to the selected bit line. The latch unit includes a plurality of latch circuits that are configured to latch data to be programmed into a memory cell or that are coupled to the sense node in order to store data programmed into a memory cell. The bit line voltage control unit coupled to the selected bit line is configured to classify program states of memory cells into first to $n^{th}$ groups by performing first to $n^{th}$ verification operations after a first program operation of a program operation and is configured to control a voltage level of the sense control signal in order to transfer a bit line voltage to the selected bit line, where n is an integer greater than one.

The verification voltages of the first to $n^{th}$ verification operations sequentially increase.

The bit line voltage control unit is configured to increase the bit line voltage by a first voltage whenever a program operation is repeated from a third program operation after the program states of memory cells are grouped into the first to $n^{th}$ groups.

The bit line voltage control unit comprises an enable signal generation unit configured to output one of first to $n^{th}$ verification enable signals according to a combination of a group selection signal, a respective one of a first to $n^{th}$ verification start signals, and a respective one of first to $(n-1)^{th}$ group signals; a group signal generation unit configured to output one of the first to $n^{th}$ group signals selected in response to the verification enable signal output from the enable signal generation unit; a voltage supply unit configured to provide a group voltage having a voltage level corresponding to a voltage level of the sense control signal, which is set according to a corresponding group, in response to the first to $n^{th}$ group signals; and a voltage control unit configured to supply the sense unit with a signal, having the voltage level supplied by the voltage supply unit, as the sense control signal in response to a sense enable signal.

The enable signal generation unit comprises a first verification enable signal generation unit configured to output the first verification enable signal according to a combination of a first verification signal and the group selection signal; and second to $n^{th}$ verification enable signal generation units configured to output second to $n^{th}$ verification enable signals, respectively, wherein the $k^{th}$ verification enable signal is produced by performing a logical combination of $k^{th}$ verification signal, the group selection signal, and $(k-1)^{th}$ group signal, where k is a natural number that satisfies $2<k\leq n$.

The group signal generation unit comprises N switching elements turned on in response to one of the first to $n^{th}$ verification enable signals and respectively coupled between first to $n^{th}$ group signal output terminals configured to output respective first to $n^{th}$ group signals according to a verification result of the latch unit; and a page buffer circuit comprising N capacitors coupled between each of the first to $n^{th}$ group signal output terminals and a ground node.

The voltage supply unit comprises N buffers configured to receive a group voltage as large as a voltage level of the sense control signal, set according to each of the first to $n^{th}$ groups. The N buffers operate in response to the respective first to $n^{th}$ group signals.

The voltage control unit comprises charging means charged with one of first to $n^{th}$ group voltages output from the voltage supply unit; a page buffer comprising switching means switched to output a sense control signal having a voltage level charged by the charging means in response to the sense enable signal.

According to another embodiment, a nonvolatile memory device comprises a memory cell array comprising a number of memory blocks each including memory cells for storing data, the memory cells being coupled by a bit line and a word line; and a page buffer unit coupled to the bit line and configured to include page buffers each comprising a plurality of latch circuits, wherein the latch circuits are configured to latch data to be programmed into a memory cell or store data programmed into a memory cell, and each of the page buffers is configured to classify memory cells into first to $n^{th}$ groups according to a program degree of each memory cell by performing first to $n^{th}$ verification operations upon a verification operation subsequent to a program operation according to a first program pulse and is configured to precharge a bit line to a voltage set on a group basis, wherein n is an integer greater than one.

According to yet another embodiment, a method of operating a nonvolatile memory device comprises a step of performing a first program operation by applying a first program pulse to a selected word line with; a bit line group classification step of performing first to $n^{th}$ verification operations using respective first to $n^{th}$ verification voltages, in performing a verification operation for the first program operation, and classifying bit lines into first to $n^{th}$ groups according to each of the verification results; a step of setting a bit line voltage to each of the classified first to $n^{th}$ groups; a second program and verification step of, before performing a program operation according to a second program pulse, precharging a bit line, corresponding to each of the groups, to the set bit line voltage, performing a second program operation, and performing a verification operation using the $n^{th}$ verification voltage; and an $n^{th}$ program and verification step of, if a result of an $(n-1)^{th}$ program and verification step is not a program pass, before performing a program operation according to an $(n-1)^{th}$ program pulse, gradually raising a bit line voltage corresponding to each of the groups by a first voltage, precharging a bit line to the raised bit line voltage, performing an $n^{th}$ program operation, and performing a verification operation using an $n^{th}$ verification voltage, wherein n is an integer greater than one.

The bit line group classification step includes performing the first verification operation using the first verification voltage, and classifying a bit line to which memory cells that have not passed the first verification operation is coupled as the first group; performing the second verification operation on memory cells that have passed the first verification operation using the second verification voltage higher than the first verification operation, and classifying a bit line to which memory cells that have passed the first verification operation, but not passed the second verification operation is coupled as the second group; and performing an $n^{th}$ verification operation on memory cells that have passed an $(n-1)^{th}$ verification operation using the $n^{th}$ verification voltage higher than an $(n-1)^{th}$ verification voltage, and classifying a bit line to which memory cells that have not passed the first verification operation is coupled as the $n^{th}$ group.

The bit line voltages of the first to $n^{th}$ groups are set to sequentially increase.

In the $n^{th}$ program and verification step, the bit line voltage of each of the groups is a voltage in which a first set bit line voltage and (n−1) times of the first voltage are added.

DESCRIPTION OF EMBODIMENTS

Figure 1:
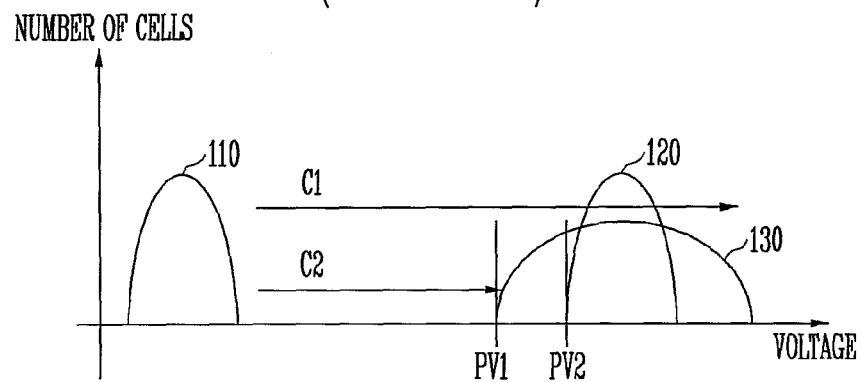
FIG. 1 is a diagram showing verification voltages when a double verification operation is performed in the distributions of threshold voltages.

Hereinafter, some embodiments of the present disclosure will be described in detail with reference to accompanying drawings. The drawing figures are provided to allow those having ordinary skill in the art to understand the scope of the embodiment of the disclosure.

Figure 2A:
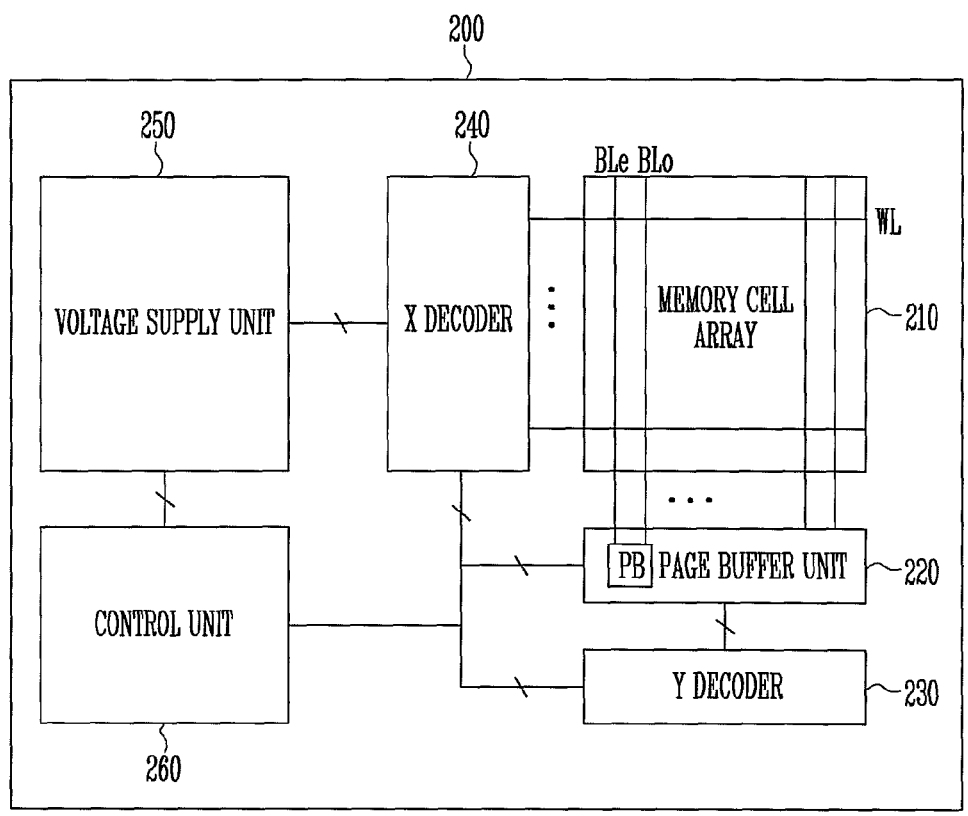
FIG. 2A is a block diagram of a nonvolatile memory device according to some embodiments.

FIG. 2A is a block diagram of a nonvolatile memory device according to some embodiments.

Referring to FIG. 2A, a nonvolatile memory device 200 according to the present embodiment includes a memory cell array 210, a page buffer unit 220, a Y decoder 230, an X decoder 240, a voltage supply unit 250, and a control unit 260.

The memory cell array 210 includes memory blocks each including memory cells for storing data. The memory cells are connected to each other by word lines and bit lines.

The page buffer unit 220 includes page buffers PB coupled to the bit lines. The page buffer PB is coupled to the memory cell through the bit lines configured to store data to be programmed into a memory cell or read and store data programmed into a memory cell.

The Y decoder 230 is configured to provide the page buffers PB of the page buffer unit 220 with a data I/O path. The X decoder 230 is configured to select and enable a memory block of the memory cell array 210 and couple the word lines of an enabled memory block to global word lines through which an operating voltage is supplied.

The voltage supply unit 250 is configured to generate an operating voltage supplied to the global word lines. The control unit 260 is configured to control the page buffer unit 220, the Y decoder 230, the X decoder 240, and the voltage supply unit 250.

The page buffer PB is configured to control a bit line voltage according to the program state of a memory cell in a program operation and have the following circuit.

Figure 2B:
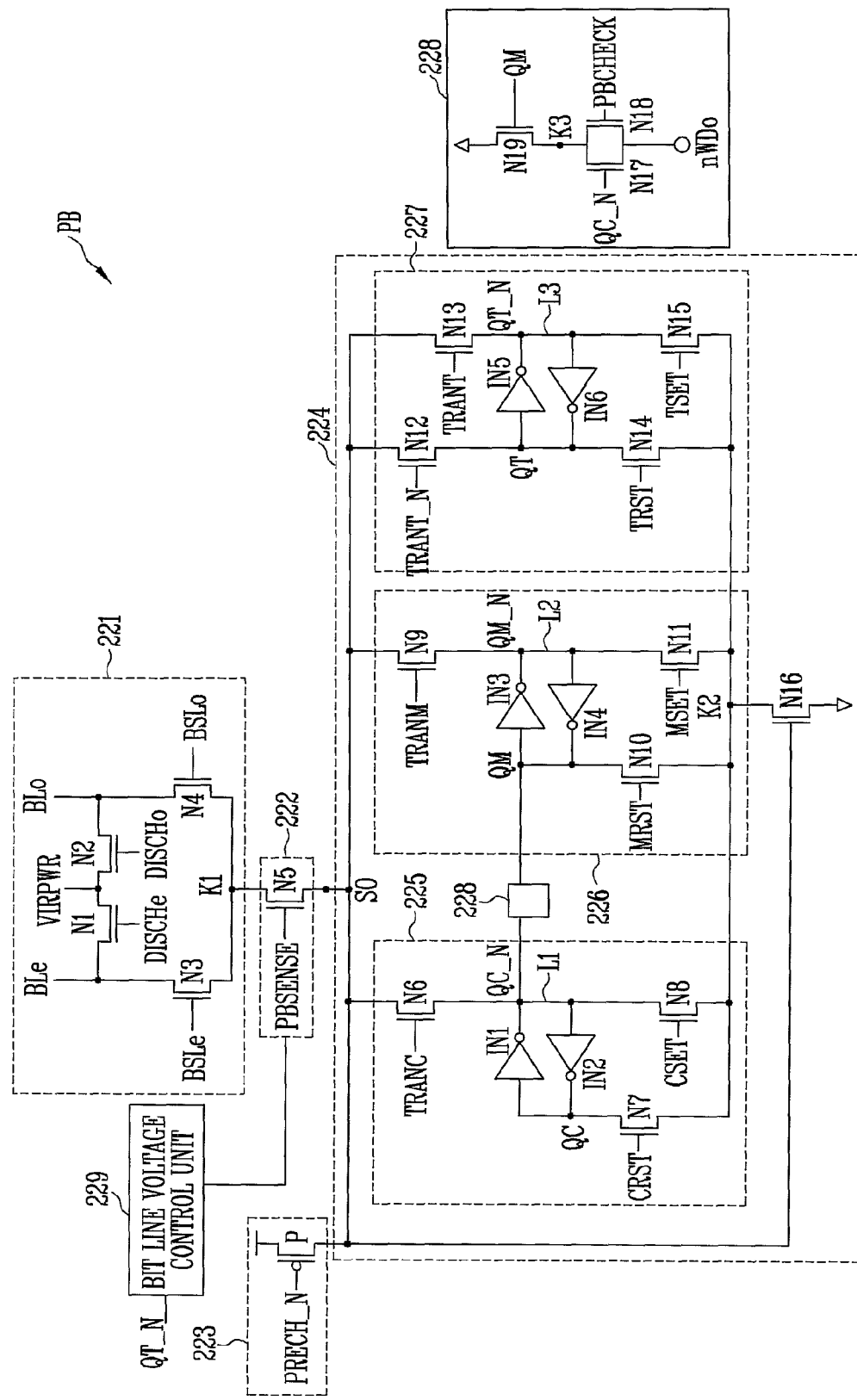
FIG. 2B is a circuit diagram of a page buffer unit shown in FIG. 2A.

FIG. 2B is a circuit diagram of the page buffer unit shown in FIG. 2A.

Referring to FIG. 2B, a page buffer PB includes a bit line selection unit 221, a sense unit 222, a precharge unit 223, a latch unit 224, a verification unit 228, and a bit line voltage control unit 229. Furthermore, the latch unit 224 includes first to third latch circuits 225 to 227.

The bit line selection unit 221 is configured to select an even bit line BLe and an odd bit line BLo. The sense unit 222 is configured to detect the voltage of a bit line coupled thereto by the bit line selection unit 221. A result detected by the sense unit 222 is reflected at a sense node SO.

The precharge unit 223 is configured to precharge the sense node SO. The latch unit 224 includes a number of latch circuits coupled to the sense node SO. The latch unit 224 is configured to store data from a memory cell in a latch circuit according to the voltage level of the sense node SO, or store data to be programmed in a corresponding latch circuit and transfer the stored data to the sense node SO.

The latch unit 224 includes the first to third latch circuits 225 to 227. The first latch circuit 225 is configured to receive data for a cache program or temporarily store and output read data. Furthermore, the second latch circuit 226 and the third latch circuit 227 are configured to perform a data program operation.

The verification unit 228 is coupled between the first and second latch circuits 225 and 226 and is configured to output a verification signal for a verification operation.

Furthermore, the bit line voltage control unit 229 is configured to control the program operations of memory cells by performing verification operations N times by using N verification voltages when performing a verification operation using a first program pulse, dividing memory cells that have passed respective verification processes into N groups, determining the program speed of each of the N groups, setting a bit line voltage for each group, performing a verification operation subsequent to a second program pulse only once, and controlling a degree that a program voltage rises for each of the N groups. In the present embodiment, it is assumed that 'N' is set to 4, the memory cells are classified into four groups, and the bit line voltage of each group is controlled.

The bit line selection unit 221 includes first to fourth NMOS transistors N1 to N4. The sense unit 222 includes a fifth NMOS transistor N5. The precharge unit 223 includes a PMOS transistor P.

Furthermore, the first latch circuit 225 includes sixth to eighth NMOS transistors N6 to N8 and first to second inverters IN1 and IN2. The second latch circuit 226 includes ninth to eleventh NMOS transistors N9 to N11 and third and fourth inverters IN3 and IN4.

The third latch circuit 227 includes twelfth to fifteenth NMOS transistors N12 to N15 and fifth and sixth inverters IN5 and IN6. The verification unit 228 includes seventeenth to nineteenth NMOS transistors N17 to N19.

The first and second NMOS transistors N1 and N2 are connected in series between the even bit line BLe the odd bit line BLo. A variable voltage VIRPWR is coupled between the first and second NMOS transistors N1 and N2. The variable voltage VIRPWR is configured to supply a power source voltage VCC for program inhibition or voltage of 0 V for discharging when a program operation is performed. Furthermore, discharge control signals DISCHe and DISCHo are input to the respective gates of the first and second NMOS transistors N1 and N2.

The third NMOS transistor N3 is coupled between the even bit line BLe and a node K1. An even bit line select signal BSLe is input to the gate of the third NMOS transistor N3.

The fourth NMOS transistor N4 is coupled between the odd bit line BLo and the node K1. An odd bit line select signal BSLo is input to the gate of the fourth NMOS transistor N4.

The fifth NMOS transistor N5 is coupled between the node K1 and the sense node SO. A sense control signal PBSENSE is input to the gate of the fifth NMOS transistor N5. The fifth NMOS transistor N5 is turned on or off in response to the voltage of a bit line connected thereto and the voltage level of the sense control signal PBSENSE.

When the fifth NMOS transistor N5 is turned on or off, the voltage level of the sense node SO changes, and so data stored in the latch unit 224 is changed.

The PMOS transistor P is connected between a power source voltage and the sense node SO. A precharge control signal PRECH_N is input to the gate of the PMOS transistor P.

Furthermore, the sixth NMOS transistor N6 is connected between the sense node SO and a node QC_N. A first data transmission signal TRANC is input to the gate of the sixth NMOS transistor N6.

The first and second inverters IN1 and IN2 are connected between a node QC and the node QC_N in the form of a latch circuit, thus constituting a first latch L1.

The seventh NMOS transistor N7 is coupled between the node QC and a node K2. The eighth NMOS transistor N8 is coupled between the node QC_N and the node K2. Furthermore, a first reset signal CRST and a first set signal CSET are input to the respective gates of the seventh and eighth NMOS transistors N7 and N8.

The ninth NMOS transistor N9 is coupled between the sense node SO and a node QM_N. A second data transmission signal TRANM is input to the gate of the ninth NMOS transistor N9. Furthermore, the third and fourth inverters IN3 and IN4 are coupled between a node QM and the node QM_N in the form of a latch circuit, thus constituting a second latch L2.

The tenth NMOS transistor N10 is coupled between the node QM and the node K2. The eleventh NMOS transistor N11 is coupled between the node QM_N and the node K2. A second reset signal MRST and the second set signal MSET are input to the respective gates of the tenth and eleventh NMOS transistors N10 and N11.

The twelfth NMOS transistor N12 is coupled between the sense node SO and a node QT. The thirteenth NMOS transistor N13 is connected between the sense node SO and a node QT_N. A third data transmission inverse signal TRANT_N and a third data transmission signal TRANT are input to the respective gates of the twelfth and thirteenth NMOS transistors N12 and N13.

The fifth and sixth inverters IN5 and IN6 are coupled between the node QT and the node QT_N in the form of a latch circuit, thus constituting a third latch L3.

The fourteenth NMOS transistor N14 is coupled between the node QT and the node K2. The fifteenth NMOS transistor N15 is coupled between the node QT_N and the node K2. A third reset signal TRST and a third set signal TSET are input to the respective gates of the fourteenth and fifteenth NMOS transistors N14 and N15.

The sixteenth NMOS transistor IN16 is coupled between the node K2 and a ground node. The sense node SO is coupled to the gate of the sixteenth NMOS transistor N16.

The seventeenth and eighteenth NMOS transistors N17 and N18 are coupled between a node K3 and a verification signal output node nWDo. The gate of the seventeenth NMOS transistor N17 is coupled to a node QC_N. A page buffer check signal PBCHECK is input to the gate of the eighteenth NMOS transistor N18.

Furthermore, the nineteenth NMOS transistor N19 is coupled between a ground node and the node K3. The gate of the nineteenth NMOS transistor N19 is coupled to a node QM.

The bit line voltage control unit 229 of the page buffer PB according to some embodiments is constructed as follows.

Figure 2C:
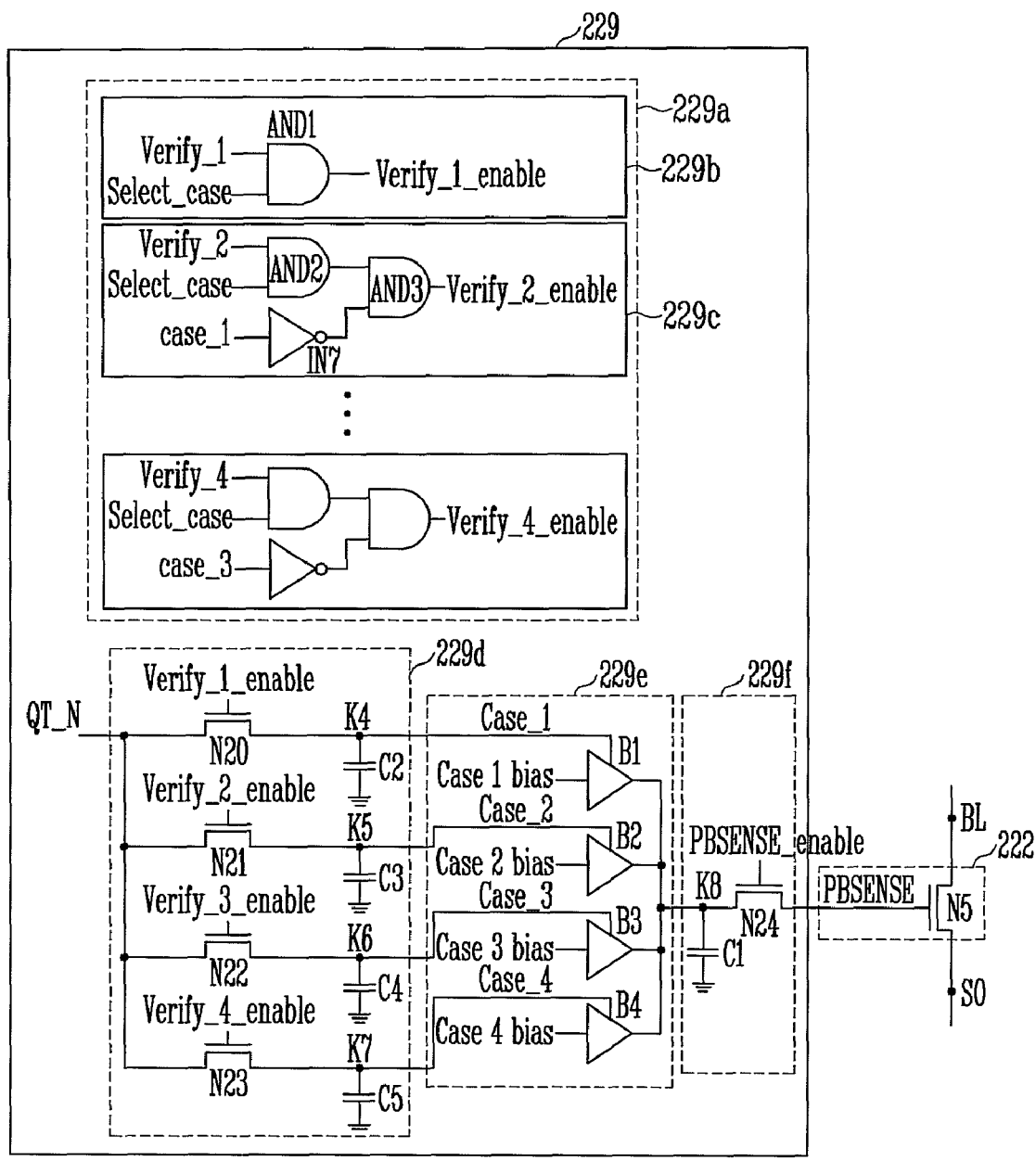
FIG. 2C is a circuit diagram of a bit line voltage control unit shown in FIG. 2B.

FIG. 2C is a circuit diagram of the bit line voltage control unit shown in FIG. 2B.

Referring to FIG. 2C, the bit line voltage control unit 229 includes an enable signal generation unit 229a, a group signal generation unit 229d, a voltage supply unit 229e, and a voltage control unit 229f.

The enable signal generation unit 229a is configured to generate a verification enable signal, enabling the voltage decoding unit 229d to decode a bit line voltage, according to a group including bit lines.

The group signal generation unit 229d is configured to generate a group signal, controlling the supply of a bit line voltage, in response to a verification enable signal generated by the verification enable signal generation unit 229a. The voltage supply unit 229e is configured to output a group voltage according to each group in response to a group signal generated by the group signal generation unit 229d.

Furthermore, the voltage supply unit 229f inputs a group voltage, output from the voltage supply unit 229e, to the gate of the fifth NMOS transistor N5 of the sense unit 222 in response to a sense enable signal PBSENSE_enable.

A degree to which the fifth NMOS transistor N5 is turned on is changed according to the level of voltage input to the gate of the fifth NMOS transistor N5. The precharge voltage level of a bit line is changed according to degree to which that the fifth NMOS transistor N5 is turned on.

The enable signal generation unit 229a includes a first verification enable signal generation unit 229b, a second verification enable signal generation unit 229c, and third and fourth verification enable signal generation units (not shown). The third and fourth verification enable signal generation unit have a similar construction as the second verification enable signal generation unit 229c, and so only the second verification enable signal generation unit 229c is described as an example.

The first verification enable signal generation unit 229b is configured to output a first verification enable signal, and the second verification enable signal generation unit 229c is configured to a second verification enable signal.

The first verification enable signal generation unit 229b includes a first AND gate AND1, and the second verification enable signal generation unit 229c includes second and third AND gates AND2 and AND3 and a seventh inverter IN7.

Furthermore, the group signal generation unit 229d includes twentieth to twenty-third NMOS transistors N20 to N23 and second to fifth capacitors C2 to C5. The voltage supply unit 229e includes first to fourth buffers B1 to B4, and the voltage control unit 229f includes a twenty-fourth NMOS transistor N24 and a first capacitor C1.

The first AND gate AND1 is configured to produce a first verification enable signal Verify_1_enable by performing an AND operation on a first verification signal Verify_1 and a group selection signal Select_case.

The second AND gate AND2 is configured to perform an AND operation on a second verification signal Verify_2 and the group selection signal Select_case. The output signal of the second AND gate AND2 is input to the third AND gate AND3.

A first group signal case_1 output from the group signal generation unit 229e is inverted by the seventh inverter IN7 and then input to the other input terminal of the third AND gate AND3. A signal output from the third AND gate AND3 is a second verification enable signal Verify_2_enable.

Furthermore, each of the third and fourth verification enable signal generation units (not shown) includes inverters configured to invert a group signal output from a previous stage and receive the inverted signal. That is, each $n^{th}$ verification enable signal generation unit other than the first verification enable signal generation unit 229b is configured so that it does not generate the verification enable signal of a logic high level when a corresponding group signal is in a logic high level. This is because, if a memory cell has already passed a verification operation, it is not necessary to control a bit line voltage again for subsequent verification operations.

The twentieth NMOS transistor N20 of the group signal generation unit 229d is coupled between a node K4 and the node QT_N of the page buffer PB shown in FIG. 2B. A first verification enable signal Verify_1_enable is input to the gate of the twentieth NMOS transistor N20.

The twenty-first NMOS transistor N21 is coupled between the node QT_N and a node K5. A second verification enable signal Verify_2_enable is input to the gate of the twenty-first NMOS transistor N21.

The twenty-second NMOS transistor N22 is coupled between the node QT_N and a node K6. A third verification enable signal Verify_3_enable is input to the gate of the twenty-second NMOS transistor N22.

The twenty-third NMOS transistor N23 is coupled between the node QT_N and a node K7. A fourth verification enable signal Verify_4_enable is input to the gate of the twenty-third NMOS transistor N23.

Furthermore, the second capacitor C2 is coupled between the node K4 and a ground node, and the third capacitor C3 is coupled between the node K5 and a ground node. The fourth capacitor C4 is coupled between the node K6 and a ground node, and the fifth capacitor C5 is coupled between the node K7 and a ground node.

The node K4 is configured to output a first group signal Case_1, the node K5 is configured to output a second group signal Case_2, the node K6 is configured to output a third group signal Case_3, and the node K7 is configured to output a fourth group signal Case_4.

When the first group signal Case_1 of a logic high level is input, the first buffer B1 of the voltage supply unit 229e outputs a first group voltage (Case 1 bias) to a node K8. When the second group signal Case_2 of a logic high level is input, the second buffer B2 outputs a second group voltage (Case 2 bias) to the node K8.

When the third group signal Case_3 of a logic high level is input, the third buffer B3 outputs a third group voltage (Case 3 bias) to the node K8. When the fourth group signal Case_4 of a logic high level is input, the fourth buffer B4 outputs the fourth group voltage (Case 4 bias) to the node K8.

Further, the first capacitor C1 is coupled between the node K8 and a ground node, and the twenty-fourth NMOS transistor N24 is coupled between the node K8 and a fifth NMOS transistor N5. A sense enable signal PBSENSE_enable is input to the gate of the twenty-fourth NMOS transistor N24.

When the twenty-fourth NMOS transistor N24 is turned on, a sense control signal PBSENSE having a voltage level precharged in the first capacitor C1 is input to the fifth NMOS transistor N5.

In general, the voltage level of the sense control signal PBSENSE is controlled by the control unit 260. However, in the case where, as in the present embodiment, the bit line voltage control unit 229 is configured to control the voltage level of the sense control signal PBSENSE in order to control the voltage of a bit line, the sense control signal PBSENSE input from the control unit 260 may be input to the sense unit 222 or the sense control signal PBSENSE input from the bit line voltage control unit 229 may be input to the sense unit 222 through switching means (not shown) so that the control unit 260 can change the voltage level of the sense control signal PBSENSE.

The operation of the bit line voltage control unit 229 is described below.

Data latched in the first or second latch L1 or L2 of the page buffer PB is programmed into a selected bit line in response to a first program pulse.

When the program operation is performed, four verification operations are performed by sequentially raising a verification voltage from the first verification operation to the fourth verification operation.

When the first verification operation is carried out, the first verification signal Verify_1 of a logic high level is applied and the group selection signal Select_case of a logic high level is applied. When the first verification signal Verify_1 and the group selection signal Select_case both having a logic high level are applied, the first verification enable signal generation unit 229b outputs the first verification enable signal Verify_1_enable of a logic high level.

When the first verification enable signal Verify_1_enable shifts to a logic high level, the twentieth NMOS transistor N20 of the group signal generation unit 229d is turned on.

A result of the first verification operation is stored in the third latch L3 of the page buffer PB. If memory cells have passed the first verification operation, the node QT_N of the third latch L3 has a logic low level. If the memory cells have not passed the first verification operation, the node QT_N of the third latch L3 has a logic high level.

Accordingly, if the memory cell has not passed the first verification operation in the state in which the twentieth NMOS transistor N20 is turned on, the node QT_N of the logic high level is coupled to the node K4, and the second capacitor C2 is precharged. That is, memory cells coupled to a bit line belonging to a first group have a threshold voltage lower than a first verification voltage.

If the second capacitor C2 is precharged and the node K4 is coupled to the node QT_N of the logic high level, the first group signal Case_1 shifts to a logic high level. Accordingly, the first buffer B1 is actuated to transfer the first group voltage (Case 1 bias) to the node K8.

The first group voltage (Case 1 bias) transferred to the node K8 is precharged to the first capacitor C1.

In this manner, after the first to fourth verification operations are carried out, the amount of voltage precharged in the first capacitor C1 is changed depending on a state in which the memory cells coupled to the bit line are programmed.

Here, in order to prevent the verification results from being influenced mutually while the first to fourth verification operations are sequentially performed, a circuit is configured in such a manner that a previous group signal is inverted starting with the second verification enable signal generation unit 229c and then input to the third AND gate AND3, and so a verification enable signal is output.

That is, bit lines that have not passed the first verification operation have a state in which the first verification voltage (Case 1 bias) is precharged to the first capacitor C1. After the second verification operation following the first verification operation is performed, only bit lines which have passed the first verification operation, but not passed the second verification operation are selected a second group.

That is, bit lines belonging to the first group that has not passed the first verification operation has a state in which the first group signal Case_1 has already shifted to a logic high level. Accordingly, the first group signal Case_1 of the logic high level is input to the second verification enable signal generation unit 229c.

When the first group signal Case_1 has the logic high level, the seventh inverter IN7 inverts the first group signal Case_1 and outputs the result. Accordingly, the third AND gate AND3 outputs the second verification enable signal Verify_2_enable of a logic low level irrespective of the output signal level of the second AND gate AND2. Consequently, groups can be classified in such a manner that a verification enable signal in the immediately preceding step is received so that the groups overlap each other.

Meanwhile, in the state in which voltage for a group, classified according to a degree to which each of memory cells coupled to a bit line is programmed, is precharged in the first capacitor C1, all verification operations are finished, and a program pulse for the second program operation is then applied.

Here, before the second program operation is performed, a bit line is precharged on the basis of each of classified groups. To this end, after the sense node SO is precharged to a logic high level, the sense enable signal PBSENSE_enable of a logic high level is input, thereby turning on the twenty-fourth NMOS transistor N24.

When the twenty-fourth NMOS transistor N24 is turned on, the sense control signal PBSENSE having the level of a group voltage precharged in the first capacitor C1 is applied to the fifth NMOS transistor N5, and the bit line is precharged according to a degree to which the fifth NMOS transistor N5 is turned on.

Next, when the second program operation is performed, the program speeds of memory cells are controlled based on a voltage precharged in a bit line to which the memory cells belong, and so the memory cells are programmed to have a narrow threshold voltage distribution.

Furthermore, when a verification operation subsequent to the second program operation is performed, the verification operation is performed only once using a fourth verification voltage used for the fourth verification operation. If a program pass has not been obtained, the third program operation is performed again. Here, even before the third program operation is performed, bit lines are precharged to a voltage stored in the first capacitor C1 in the same manner as before the second program operation was performed.

The above program operation is described in more detail below.

Figure 3:
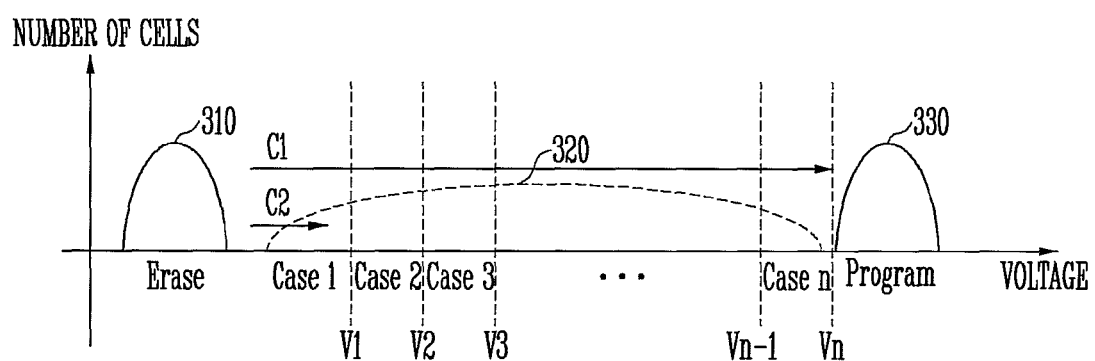
FIG. 3 is a diagram showing the distributions of verification voltages and threshold voltages when a program operation is performed according to some embodiments.

FIG. 3 is a diagram showing the distributions of verification voltages and threshold voltages when a program operation is performed according to some embodiments.

Referring to FIG. 3, memory cells having a first threshold voltage distribution 310 are memory cells having an erase state, and memory cells having a third threshold voltage distribution 330 are memory cells that have been programmed.

A second threshold voltage distribution 320 indicates a threshold voltage distribution of memory cells after a first program operation has been performed.

In FIG. 3, after the first program operation is performed, in order to classify the memory cells having the second threshold voltage distribution 320 into first to $n^{th}$ groups, first to $n^{th}$ verification operations using respective first to $n^{th}$ verification voltages are performed.

Furthermore, after the second program operation is performed, a verification operation is performed only once using the $n^{th}$ verification voltage. In the present embodiment, it is assumed that only up to the fourth verification operation is performed.

Figure 4A:
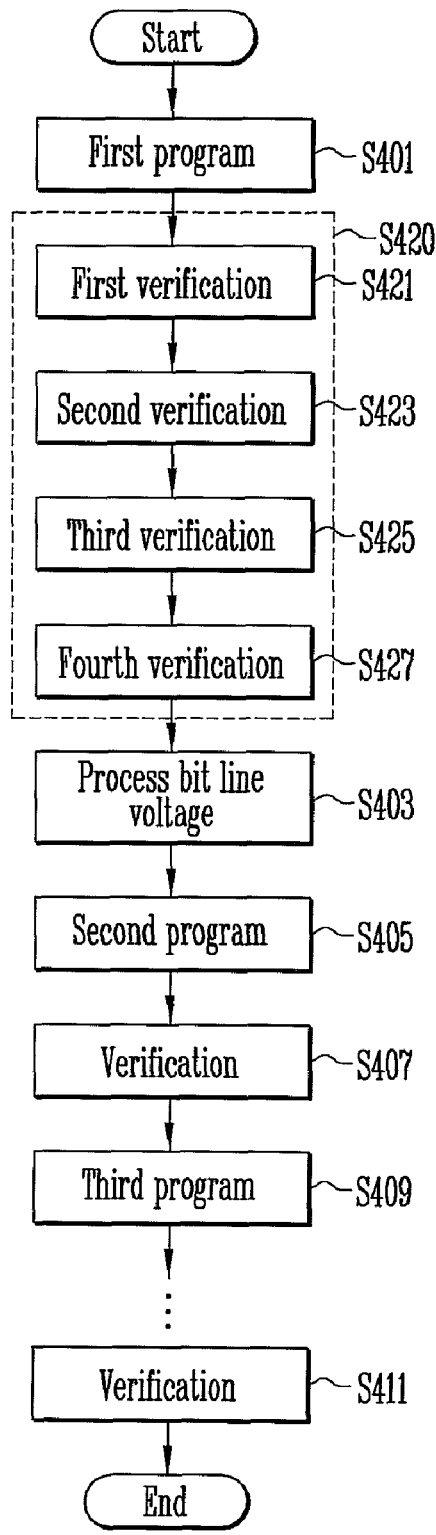
FIG. 4A is a flowchart illustrating a program operation in which the distribution of threshold voltages is changed as in FIG. 3.

FIG. 4A is a flowchart illustrating a program operation in which the distribution of threshold voltages is changed as in FIG. 3.

Referring to FIG. 4A, when program begins, a first program operation is performed according to a first program pulse at step S401. Here, the first program method is known, and a description thereof is omitted.

After the first program operation is performed, a verification operation is performed. In order to classify bit lines into groups, first to fourth verification operations are carried out at step S420.

In the first to fourth verification operations, as described above, verification operations are performed by applying respective first to fourth verification voltages at steps S421 to S427, first to fourth verification signals Verify_1 to Verify_4 for the respective first to fourth verification operations, together with a group selection signal, are sequentially output as a high logic level in order to classify the bit lines into the groups, and voltages for the respective groups are set.

Voltage of bit lines belonging to the same group is processed based on a result of each of the verification operations at step S403, and the voltage level of the first capacitor C1 of the page buffer PB coupled to each bit line is set. Furthermore, the bit lines are precharged according to the level of voltage precharged in the first capacitor C1.

Here, the first verification voltage of the first to fourth verification voltages has the lowest voltage level, and the voltage level rises toward the fourth verification voltage. The amounts of voltages precharged in respective bit lines are determined by the first to fourth group voltages (Case 1 bias to Case 2 bias). The difference in the voltage between the groups may be set to 'a'.

That is, voltage precharged in the bit lines of the first group is '0', 'a' is precharged in the bit lines of the second group, '2' is precharged in the bit lines of the third group, and '3a' is precharged in the bit lines of the fourth group.

When the second program operation is performed at step S405, each of the bit lines has a different degree to which a program voltage is recognized according to a precharged voltage level.

That is, assuming that, when a program is performed using an ISPP method, an initial program start voltage is Vs and a step voltage is dVt, voltage applied to a word line when the second program operation is performed is 'Vp1+dVt'.

The verification operation of step S420 is described in more detail below.

Figure 4B:
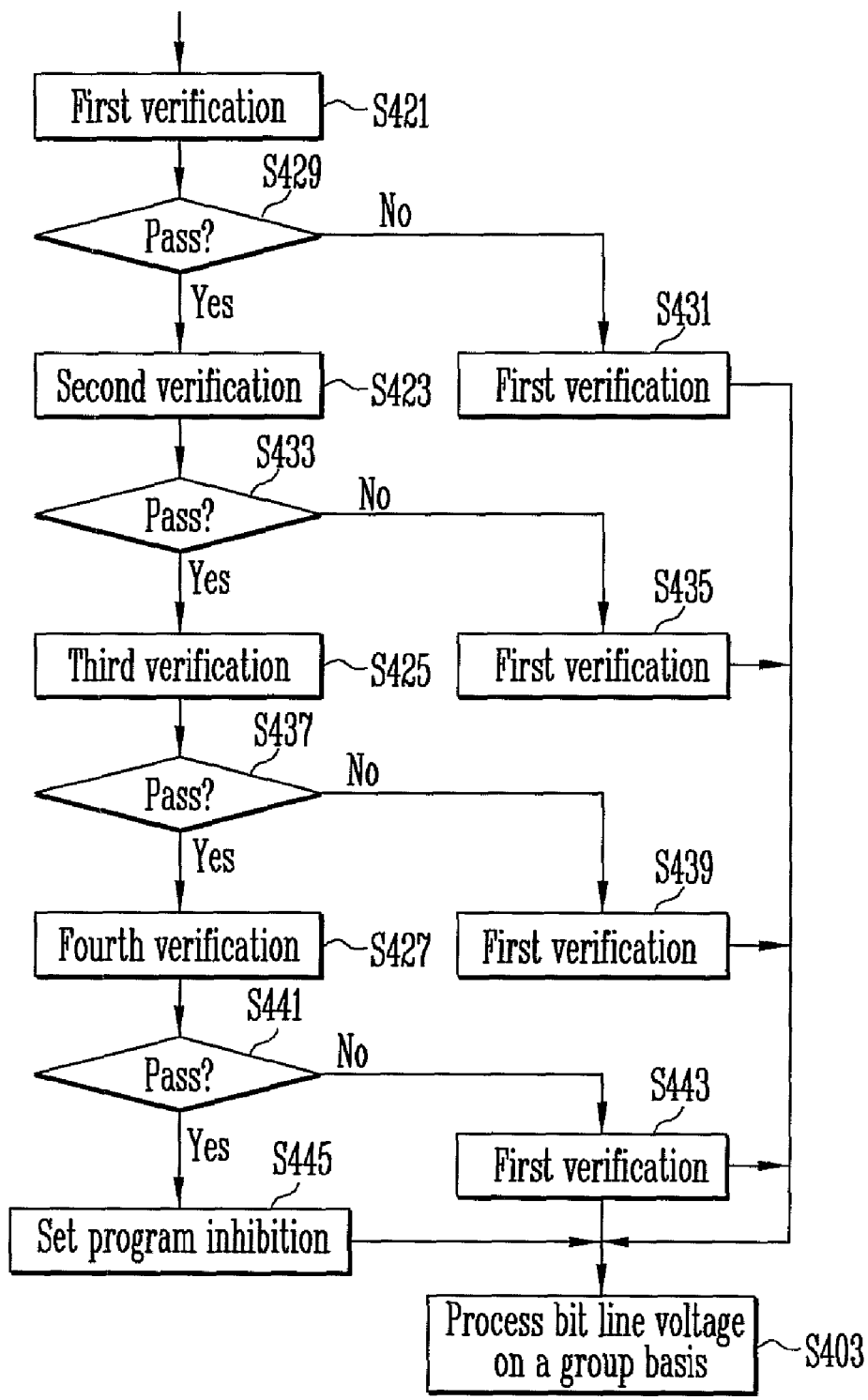
FIG. 4B is an operational flowchart of the verification step shown in FIG. 4A.

FIG. 4B is an operational flowchart of the verification step shown in FIG. 4A.

Referring to FIG. 4B, when the four verification operations are performed after the first program operation (S401), the first verification operation is performed using the first verification voltage at step S421. It is determined whether a result of the verification operation is a pass at step S429. Bit lines that have not passed the first verification operation are classified as the first group at step S431.

Next, the second verification operation is performed on bit lines that have passed the first verification operation at step S423. Bit lines that have not passed the second verification operation are classified as the second group at steps S433 and S435.

Next, the third verification operation is performed on bit lines that have passed the second verification operation at step 5425. Bit lines that have not passed the third verification operation are classified as the third group at steps S437 and S439.

Next, the fourth verification operation is performed on bit lines that have passed the third verification operation at step S441. Bit lines that have not passed the fourth verification operation are classified as the fourth group at steps S441 and S443.

Since the bit lines that have passed the fourth verification operation have been programmed, program inhibition for the bit lines is set. Voltage of the bit lines classified as each of the first to fourth groups is processed on a group basis at step S403.

Figure 5:
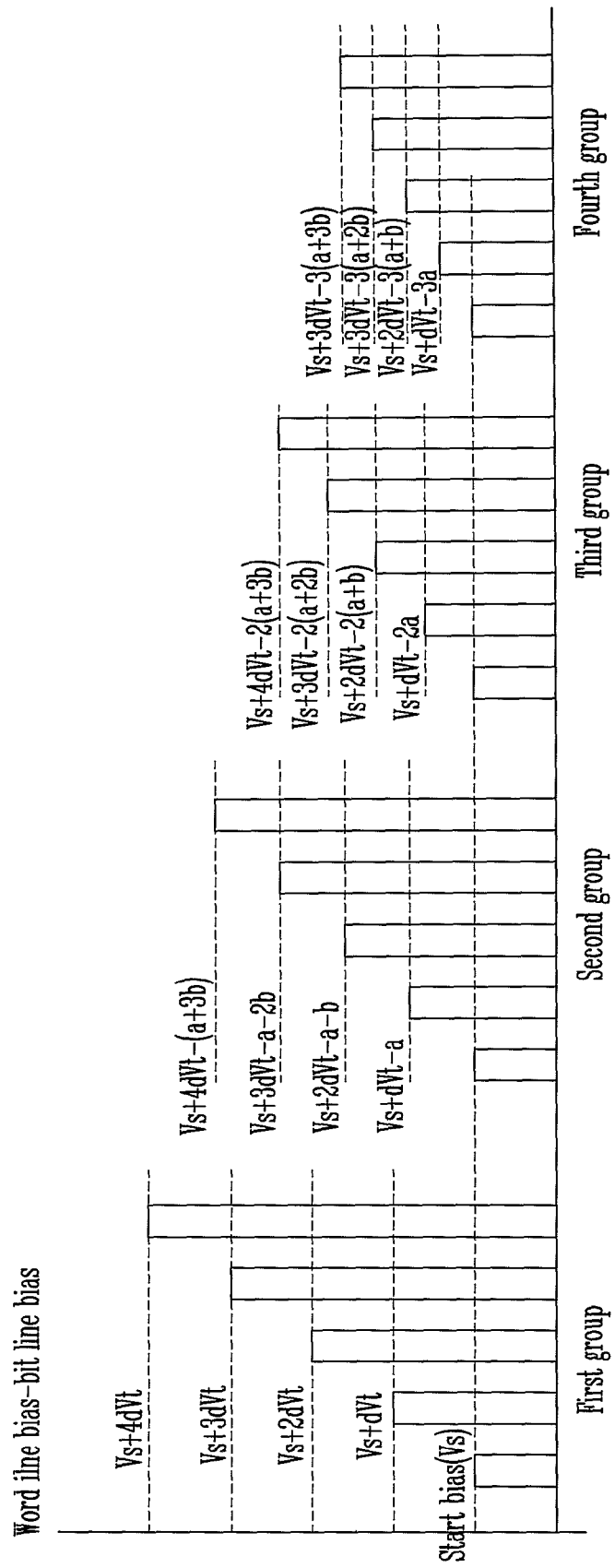
FIG. 5 is a diagram showing the levels of program voltages applied to a word line of each of bit line groups when a program operation is performed according to some embodiments.

Here, voltages being recognized as actual voltages applied to a word line on a group basis according to voltage precharged in each bit line are shown in FIG. 5.

FIG. 5 is a diagram showing the levels of program voltages applied to a word line of each of bit line groups when a program operation is performed according to some embodiments.

Referring to FIG. 5, in the second program operation, a word line of each group operates as if a voltage in which a voltage precharged in a bit line has been subtracted from an actual program voltage applied to the word line has been applied to the word line.

That is, the first group is recognized as being supplied with 'Vs+dVt', and the second group is recognized as being supplied with 'Vs+dVt−a'. Further, the third group is recognized as being supplied with 'Vs+dVt−2a', and the fourth group is recognized as being supplied with 'Vs+dVt−3a'.

When, as described above, the second program operation is completed in the state in which the voltage is applied to the word line, a verification operation is performed. Here, the verification operation is performed only once using the fourth verification voltage used for the fourth verification operation at step S407.

If, as a result of the fourth verification operation, all bit lines have not passed the verification operation, the third program operation is performed again at step S409.

When the third program operation is performed, a program voltage is 'Vs+2dVt'. From third program operation, a group voltage is changed on a group basis so that voltage precharged in a bit line rises as large as 'b'.

The amounts of voltages precharged in bit lines on a group basis are controlled as in the following table.

|  | STEP2 | STEP3 | STEP4 | STEP5 |
|---|---|---|---|---|
| Case1 | 0 V | 0 V | 0 V | 0 V |
| Case2 | a | a + b | a + 2 · b | a + 3 · b |
| Case3 | 2 · a | 2(a + b) | 2(a + 2 · b) | 2(a + 3 · b) |
| Case4 | 3 · a | 3(a + b) | 3(a + 2 · b) | 3(a + 3 · b) |

In the table, Case1 to Case4 denote the respective first to fourth groups, Step 2 is a voltage recognized as being applied to a word line when the second program operation is performed, and Step3 is a voltage recognized as being applied to a word line when the third program operation is performed.

As shown in the table, when the second program operation is performed, set voltages are applied to bit lines according to the respective results of the first to fourth verification operations. From the third program operation, a voltage applied to each bit line is controlled so that 'a' rises by 'b' with the progress of the program.

The bit line voltages may be controlled by adjusting the group voltages (Case 1 bias to Case 4 bias) in FIG. 2B.

After the bit lines are set as in the above table, the level of voltage applied to a word line is changed on a group basis as shown in FIG. 5.

From the comparison of the first group and the fourth group shown in FIG. 5, it can be seen that a relatively small program step voltage is applied to the fourth group because the fourth group includes memory cells having a relatively fast program speed, as compared with the first group. Accordingly, the program speed of the memory cells belonging to the fourth group is controlled to be slow as compared with that of the memory cells belonging to the first group.

Figure 6:
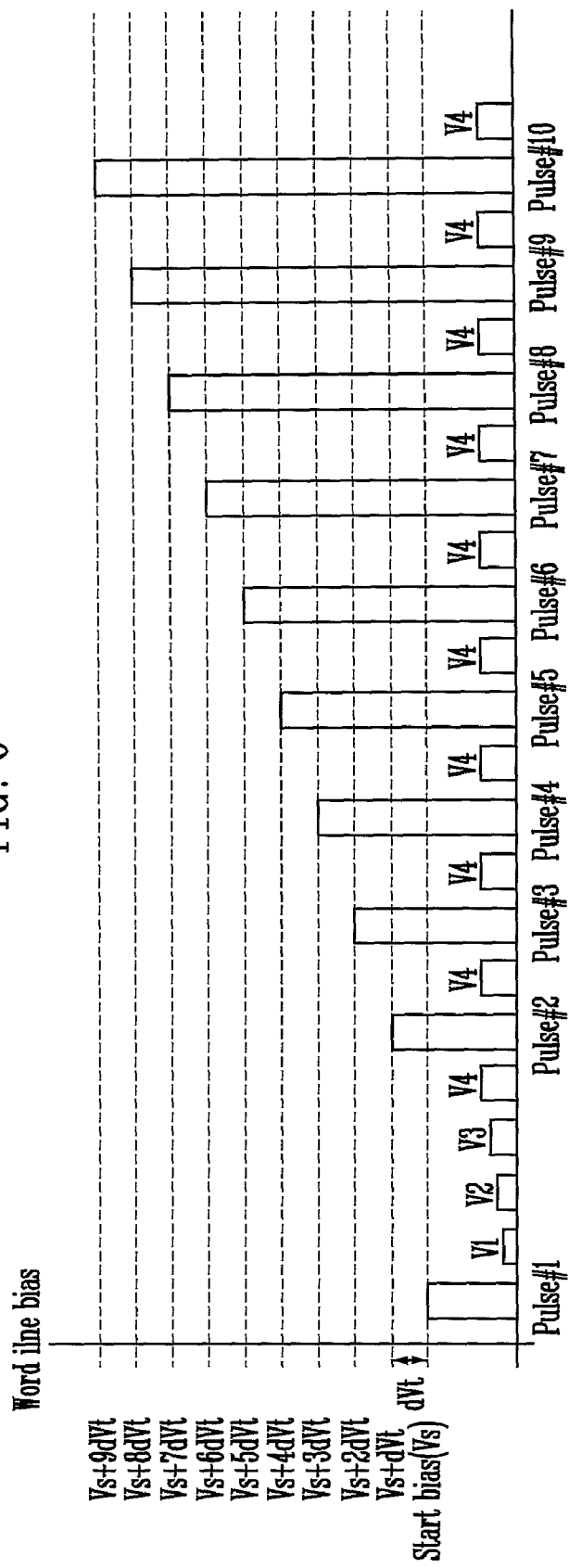
FIG. 6 is a diagram showing program voltages applied in a program operation according to some embodiments.

While the program operation as shown FIG. 4 is performed, actual voltages applied to the word lines are shown in FIG. 6.

FIG. 6 is a diagram showing program voltages applied in a program operation according to some embodiments.

Referring to FIG. 6, when the first program operation is performed, a start voltage 'Vs' is applied. Thereafter, in order to classify bit lines into the first to fourth groups, verification voltages are applied to the respective first to fourth groups. After the second program operation is performed, only the fourth verification voltage is applied. Further, each of the program voltages is raised by a step voltage dVt.

As described above, according to the page buffer circuit, the nonvolatile memory device including the page buffer circuit, and the method of operating the nonvolatile memory device, voltages applied to respective bit lines are controlled based on the program speeds of memory cells by performing a verification operation for the first program pulse using a number of verification voltages. Accordingly, the memory cells can have a threshold voltage distribution with a narrow width thereof by controlling the program speed of the memory cells, and so the time that it takes to perform a program can be reduced.

What is claimed is:

1. A page buffer circuit, comprising:
a sense unit configured to couple a bit line and a sense node in response to a sense control signal to detect a voltage of the selected bit line or transfer a voltage of the sense node to the selected bit line;
a latch unit comprising a plurality of latch circuits that are configured to latch data to be programmed into a memory cell or that are coupled to the sense node in order to store data programmed into a memory cell; and
a bit line voltage control unit coupled to the selected bit line and configured to classify program states of memory cells into first to $n^{th}$ groups by performing first to $n^{th}$ verification operations after a first program operation of a program operation and further configured to control a voltage level of the sense control signal in order to transfer a bit line voltage to the selected bit line, where n is an integer greater than one.

2. The page buffer circuit of claim 1, wherein verification voltages of the first to $n^{th}$ verification operations sequentially increase.

3. The page buffer circuit of claim 1, wherein the bit line voltage control unit is configured to increase the bit line voltage by a first voltage whenever a program operation is repeated from a third program operation after the program states of memory cells are grouped into the first to $n^{th}$ groups.

4. The page buffer circuit of claim 1, wherein the bit line voltage control unit comprises:
an enable signal generation unit configured to output one of first to $n^{th}$ verification enable signals according to a combination of a group selection signal, a respective one of a first to $n^{th}$ verification start signals, and a respective one of a first to $(n-1)^{th}$ group signals;
a group signal generation unit configured to output one of the first to $n^{th}$ group signals selected in response to the verification enable signal output from the enable signal generation unit;
a voltage supply unit configured to provide a group voltage having a voltage level corresponding to a voltage level of the sense control signal, which is set according to a corresponding group, in response to the first to $n^{th}$ group signals; and
a voltage control unit configured to supply the sense unit with a signal, having the voltage level supplied by the voltage supply unit, as the sense control signal in response, to a sense enable signal.

5. The page buffer circuit of claim 4, wherein the enable signal generation unit comprises:
a first verification enable signal generation unit configured to output the first verification enable signal according to a combination of a first verification signal and the group selection signal; and
second to $n^{th}$ verification enable signal generation units configured to output second to $n^{th}$ verification enable signals, respectively, wherein the $k^{th}$ verification enable signal is produced by performing a logical combination of $k^{th}$ verification signal, the group selection signal, and $(k-1)^{th}$ group signal, where k is a natural number that satisfies $2<k\leq n$.

6. The page buffer circuit of claim 4, wherein the group signal generation unit comprises:
   N switching elements turned on in response to one of the first to $n^{th}$ verification enable signals and respectively coupled between first to $n^{th}$ group signal output terminals configured to output respective first to $n^{th}$ group signals according to a verification result of the latch unit; and
   a page buffer circuit comprising N capacitors coupled between each of the first to $n^{th}$ group signal output terminals and a ground node.

7. The page buffer circuit of claim 4, wherein:
   the voltage supply unit comprises N buffers configured to receive a group voltage as large as a voltage level of the sense control signal, set according to each of the first to $n^{th}$ groups, and
   the N buffers operate in response to the respective first to $n^{th}$ group signals.

8. The page buffer circuit of claim 4, wherein the voltage control unit comprises:
   charging means charged with one of first to $n^{th}$ group voltages output from the voltage supply unit;
   a page buffer comprising switching means switched to output a sense control signal having a voltage level charged by the charging means in response to the sense enable signal.

9. A nonvolatile memory device, comprising:
   a memory cell array comprising a number of memory blocks each including memory cells for storing data, the memory cells being coupled by a bit line and a word line; and
   a page buffer unit coupled to the bit line and configured to include page buffers each comprising a plurality of latch circuits, wherein the latch circuits are configured to latch data to be programmed into a memory cell or store data programmed into a memory cell, and each of the page buffers is configured to classify memory cells into first to $n^{th}$ groups according to a program degree of each memory cell by performing first to $n^{th}$ verification operations upon a verification operation subsequent to a program operation according to a first program pulse and is configured to precharge a bit line to a voltage set on a group basis, wherein n is an integer greater than one.

10. The nonvolatile memory device of claim 9, wherein each of the page buffers included in the page buffer unit comprises:
    a sense unit configured to couple a bit line and a sense node in response to a sense control signal and, when detecting a voltage of the selected bit line or transferring a voltage of the sense node to the selected bit line according to a voltage level of the sense control signal, transfer voltages having different voltage levels to the bit line according to a voltage level of the sense control signal;
    a latch unit comprising the plurality of latch circuits coupled to the sense node; and
    a bit line voltage control unit configured to classify program states of memory cells, coupled to the selected bit line, into first to $n^{th}$ groups by performing first to $n^{th}$ verification operations after a first program operation of a program operation and to control a voltage level of the sense control signal in order to transfer a bit line voltage, set on a group basis, to the selected bit line,
    wherein verification voltages of the first to $n^{th}$ verification operations sequentially increase.

11. The nonvolatile memory device of claim 10, wherein the bit line voltage control unit is configured to increase the bit line voltage by a first voltage whenever a program operation is repeated from a third program operation after the program states of memory cells are grouped into the first to $n^{th}$ groups.

12. The nonvolatile memory device of claim 11, wherein the bit line voltage control unit comprises:
    an enable signal generation unit configured to output one of first to $n^{th}$ verification enable signals according to a combination of a group selection signal, a first or $n^{th}$ verification start signal, and first to $(n-1)^{th}$ group signals;
    a group signal generation unit configured to output one of the first or second to $n^{th}$ group signals selected in response to the verification enable signal output from the enable signal generation unit;
    a voltage supply unit configured to provide a group voltage having a voltage level corresponding to a voltage level of the sense control signal, set according to a corresponding group, in response to the first to $n^{th}$ group signals; and
    a voltage control unit configured to supply the sense unit with a signal, having the voltage level supplied by the voltage supply unit, as the sense control signal in response to a sense enable signal.

13. The nonvolatile memory device of claim 12, wherein the enable signal generation unit comprises:
    a first verification enable signal generation unit configured to output the first verification enable signal according to a combination of a first verification signal and the group selection signal; and
    second to $n^{th}$ verification enable signal generation units configured to output second to $n^{th}$ verification enable signals, respectively, wherein the $k^{th}$ verification enable signal is produced by performing a logical combination of $k^{th}$ verification signal, the group selection signal, and $(k-1)^{th}$ group signal, where k is a natural number that satisfies $2<k\leq n$.

14. The nonvolatile memory device of claim 12, wherein the group signal generation unit comprises:
    N switching elements turned on in response to one of the first to $n^{th}$ verification enable signals and respectively coupled between first to $n^{th}$ group signal output terminals configured to output respective first to $n^{th}$ group signals according to a verification result of the latch unit; and
    a nonvolatile memory device comprising N capacitors coupled between each of the first to $n^{th}$ group signal output terminals and a ground node.

15. The nonvolatile memory device of claim 12, wherein:
    the voltage supply unit comprises N buffers configured to receive a group voltage as large as a voltage level of the sense control signal, set according to each of the first to $n^{th}$ groups, and
    the N buffers operate in response to the respective first to $n^{th}$ group signals.

16. The nonvolatile memory device of claim 12, wherein the voltage control unit comprises:
    charging means charged with one of first to $n^{th}$ group voltages output from the voltage supply unit;
    a page buffer comprising switching means switched to output a sense control signal having a voltage level charged by the charging means in response to the sense enable signal.

17. A method of operating a nonvolatile memory device, comprising:
- a step of performing a first program operation by applying a first program pulse to a selected word line with;
- a bit line group classification step of performing first to $n^{th}$ verification operations using respective first to $n^{th}$ verification voltages, in performing a verification operation for the first program operation, and classifying bit lines into first to $n^{th}$ groups according to each of the verification results;
- a step of setting a bit line voltage to each of the classified first to $n^{th}$ groups;
- a second program and verification step of, before performing a program operation according to a second program pulse, precharging a bit line, corresponding to each of the groups, to the set bit line voltage, performing a second program operation, and performing a verification operation using the $n^{th}$ verification voltage; and
- an $n^{th}$ program and verification step of, if a result of an $(n-1)^{th}$ program and verification step is not a program pass, before performing a program operation according to an $(n-1)^{th}$ program pulse, gradually raising a bit line voltage corresponding to each of the groups by a first voltage, precharging a bit line to the raised bit line voltage, performing an $n^{th}$ program operation, and performing a verification operation using an $n^{th}$ verification voltage, wherein n is an integer greater than one.

18. The nonvolatile memory device of claim 17, wherein the bit line group classification step includes:
- performing the first verification operation using the first verification voltage, and classifying a bit line to which memory cells that have not passed the first verification operation is coupled as the first group;
- performing the second verification operation on memory cells that have passed the first verification operation using the second verification voltage higher than the first verification operation, and classifying a bit line to which memory cells that have passed the first verification operation, but not passed the second verification operation is coupled as the second group; and
- performing an $n^{th}$ verification operation on memory cells that have passed an $(n-1)^{th}$ verification operation using the $n^{th}$ verification voltage higher than an $(n-1)^{th}$ verification voltage, and classifying a bit line to which memory cells that have not passed the first verification operation is coupled as the $n^{th}$ group.

19. The nonvolatile memory device of claim 17, wherein the bit line voltages of the first to $n^{th}$ groups are set to sequentially increase.

20. The nonvolatile memory device of claim 17, wherein in the $n^{th}$ program and verification step, the bit line voltage of each of the groups is a voltage in which a first set bit line voltage and (n−1) times of the first voltage are added.

* * * * *